(12) United States Patent
Ho

(10) Patent No.: US 6,455,926 B2
(45) Date of Patent: Sep. 24, 2002

(54) HIGH DENSITY CAVITY-UP WIRE BOND BGA

(75) Inventor: Chung Wen Ho, Monte Sereno, CA (US)

(73) Assignee: Thin Film Module, Inc., Hsin Chu (TW)

(*) Notice: Subject to any disclaimer, the term of this patent is extended or adjusted under 35 U.S.C. 154(b) by 0 days.

(21) Appl. No.: 09/900,558

(22) Filed: Jul. 9, 2001

Related U.S. Application Data

(62) Division of application No. 09/389,634, filed on Sep. 3, 1999, now Pat. No. 6,277,672.

(51) Int. Cl.⁷ .............................................. H01L 23/02
(52) U.S. Cl. ........................ 257/678; 257/700; 257/737; 257/787
(58) Field of Search ................................ 257/668, 673, 257/676, 678, 700, 701, 737, 738, 750, 758, 782, 783, 784, 787

(56) References Cited

U.S. PATENT DOCUMENTS

| | | | |
|---|---|---|---|
| 5,485,038 A | 1/1996 | Licari et al. | 257/758 |
| 5,509,553 A | 4/1996 | Hunter, Jr. et al. | 216/13 |
| 5,525,834 A * | 6/1996 | Fischer et al. | 257/691 |
| 5,656,552 A * | 8/1997 | Hudak et al. | 438/15 |
| 5,724,232 A | 3/1998 | Bhatt et al. | 361/762 |
| 5,808,873 A * | 9/1998 | Celaya et al. | 361/760 |
| 5,830,563 A | 11/1998 | Shimoto et al. | 428/209 |
| 5,837,427 A | 11/1998 | Hwang et al. | 430/312 |
| 5,854,512 A * | 12/1998 | Manteghi | 257/735 |
| 5,877,551 A * | 3/1999 | Tostado et al. | 257/701 |
| 6,020,637 A * | 2/2000 | Karnezos | 257/738 |
| 6,271,102 B1 * | 8/2001 | Brouillette et al. | 438/462 |
| 6,326,696 B1 * | 12/2001 | Horton et al. | 257/777 |
| 6,329,713 B1 * | 12/2001 | Farquhar et al. | 257/712 |

\* cited by examiner

*Primary Examiner*—Michael Sherry
*Assistant Examiner*—Scott B. Geyer
(74) *Attorney, Agent, or Firm*—George O. Saile; Stephen B. Ackerman

(57) ABSTRACT

A method is provided for mounting high-density wire bond semiconductor devices. A layer of dielectric is deposited over the first surface of a metal panel. One or more thin film interconnect layers are then created on top of the dielectric layer. The BUM technology allows for the creation of a succession of layers over the thin film layers. The combined layers of thin film and BUM form the interconnect substrate. One or more cavities are created in the second surface of the metal panel; openings through the layer of dielectric are created where the layer of dielectric is exposed. One or more wire bond semiconductor die are inserted into the cavities, are die bonded and wire bonded to the openings that have been created in the layer of dielectric. Openings are created in the bottom BUM layer; solder balls are inserted and attached to this BUM layer for the completion of the Ball Grid Array (BGA) package.

4 Claims, 4 Drawing Sheets

HIGH DENSITY CAVITY-UP WIRE BOND BGA

This application is related to Attorney Docket #TFM99-002 filed on Jun. 14, 1999, Ser. No. 09/332,427, assigned to a common assignee.

BACKGROUND OF THE INVENTION (1) Field of the Invention

The invention relates to the fabrication of integrated circuit devices and more particularly, to a novel process and structure for making packaging substrates for wire bonded semiconductor devices.

(2) Description of the Prior Art

When the dimensions of the Integrated Circuits are scaled down, the cost per die is decreased while some aspects of performance are improved. The metal connections which connect the Integrated Circuit to other circuit or system components become of relative more importance and have, with further miniaturization of the IC, an increasingly negative impact on the circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

To solve this problem, the approach has been taken to develop low resistance metal (such as copper) for the wires while low dielectric materials are used in between signal lines.

Increased Input-Output (I/O) combined with increased demands for high performance IC's has led to the development of Flip Chip Packages. Flip-chip technology fabricates bumps (typically Pb/Sn solders) on Al pads on chip and interconnect the bumps directly to the package media, which are usually ceramic or plastic based. The flip-chip is bonded face down to the package medium through the shortest path. These technologies can be applied not only to single-chip packaging, but also to higher or integrated levels of packaging in which the packages are larger and to more sophisticated substrates that accommodate several chips to form larger functional units.

The flip-chip technique, using an area array, has the advantage of achieving the highest density of interconnection to the device and a very low inductance interconnection to the package. However, pre-testability, post-bonding visual inspection, and TCE (Thermal Coefficient of Expansion) matching to avoid solder bump fatigue are still challenges. In mounting several packages together, such as surface mounting a ceramic package to a plastic board, the TCE mismatch can cause a large thermal stress on the solder-lead joints that can lead to joint breakage caused by solder fatigue from temperature cycling operations.

Prior Art substrate packaging uses ceramic and plastic Ball Grid Array (BGA) packaging. Ceramic substrate packaging is expensive and has proven to limit the performance of the overall package. Recent years have seen the emergence of plastic substrate BGA packaging; this type of packaging has become the mainstream design and is frequently used in high volume BGA package fabrication. The plastic substrate BGA package performs satisfactorily when used for low-density flip chip Integrated Circuits (IC's). If the number of pins emanating from the IC is high, that is in excess of 350 pins, or if the number of pins coming from the IC is less than 350 but the required overall package size is small (resulting in a solder ball pitch of less than 1.27 mm.), the plastic BGA structure becomes complicated and expensive. This can be traced to the multi-layer structure used to create the plastic BGA package. This multi-layer structure for the plastic BGA interconnect package is referred to as the Build Up Multilayer or BUM approach and results in a line density within the package of typically 2–3 mil or 50 u–75 u range. This line density is not sufficiently high for realizing the fan out from the chip I/O to the solder balls on the package within a single layer. This leads to the multi-layer approach. The multi-layer approach brings with it the use of relatively thick (50 u–75 u) dielectric layers, these layers have a TCE (Thermal Coefficient of Expansion) that is considerably higher than the TCE of the laminate board on which the plastic BGA package is mounted. To counteract this difference in TCE's the BUM layers must be (thermally and mechanically) balanced on the other side (the side of the board that does not usually require an interconnect density provided by the BUM layers) of the laminate board. This latter requirement results in the use of additional material and processing steps to apply these materials, increasing the cost of the BGA package and creating a yield detractor.

Another approach is the use of a flexible film as the starting material. A polymer film, such as the polyimide film or an epoxy based film of 2 to 3 mil thick with or without a copper layer attached to it, is processed by metalization and patterning on one or both sides. A completed two metal layer film, described as a layer pair, can be used as a packaging substrate material. Subsequent dielectric and copper layers can be build up on the processed first metal layer, such as the RCC (Resin Coated Copper) approach. Alternatively, two or more layer pairs can be bonded together to make a multilayer structure. The advantage of this approach is that it uses a minimum amount of material. However, because of the lack of stability of the film, the line and space density is limited to that of the BUM structure described herein, which is not sufficiently high for the high density packaging that is used to achieve a low cost substrate, having only a few interconnect layers.

Other Prior Art applications use thin film interconnect layers for flip chip or wire bond packaging substrates. These applications start with a laminate substrate onto which the thin film layers are deposited. For these applications, the laminate substrate is used as a base carrier substrate and provides the mechanical support. Plated Through Holes (PTH) are mechanically drilled through the laminate substrate and are used to establish connections to the backside of the substrate for solder ball attach and electrical contacts. By using thin films, high wire density and very thin dielectric layers can be realized. This approach also does not, unlike the BUM approach, require to counter-balance thick layers of dielectric in order to establish dimensional stability. A disadvantage of the laminate substrate is that the process of mechanically drilling holes through the laminate substrate is time-consuming thereby adding cost to the process. Further, the planarity of the laminate substrate does not meet planarity requirements for the deposition of thin films. Good planarity for the surface of the laminate substrate is established by depositing dielectrics and metal layers on the initial surface of the laminate structure, steps that again add to the processing cost of the BGA structure. Since the laminate substrate is composed using organic materials, the substrate is not dimensionally stable resulting in warpage and dimensional variations during high temperature processing and wet chemical interactions. This results in additional processing complications and costs.

The invention teaches a novel process and structure for creating packaging substrates that are used for wire bonded semiconductor devices. As such, the process and package of the invention are similar to previous high-density flip chip BGA packages. The term BGA of the invention refers to the ball grid array that is connected to for instance a Printed Circuit Board but where the contact balls of this array are connected to a (wire bonded) IC device via a substrate that is created by the process of the invention.

U.S. Pat. No. 5,509,553 (Hunter, Jr. et al.) shows a (3) metal layer process (DEMR) (see FIG. 5A) that appears to comprise a) sputter plating base b) plating metal (semi-additive plating), see col. 2.

U.S. Pat. No. 5,830,563 (Shimoto et al.) discloses a laminate substrate with thin films deposited thereon.

U.S. Pat. No. 5,837,427 (Hwang et al.) shows a (4) BUM process for a PCB.

U.S. Pat. No. 5,724,232 (Bhatt et al.) shows a package with a (1) metal substrate.

U.S. Pat. No. 5,525,834 (Fischer et al.) shows a package having a Cu substrate, thin dielectric layers (1–25 um thick) and thin dielectric layers (12 to 75 um), see col. 7 and 8.

U.S. Pat. No. 5,877,551 (Tostado et al.) discloses a package having a metal substrate with (2) dielectric layers formed of polymers, epoxy (3 to 100 um), see col. 4.

U.S. Pat. No. 5,485,038 (Licari et al.) teaches a package using a photo-imagable epoxy dielectric layer.

SUMMARY OF THE INVENTION

A principle objective of the invention is to provide an inexpensive and reliable method for high-density wire bond semiconductor device manufacturing.

Another objective of the invention is to provide a wire bond device package that significantly improves the cooling of the Integrated Circuit device that is mounted therein.

Another objective of the invention is to reduce performance limitations imposed by Prior Art high-density wire bond semiconductor manufacturing techniques.

Yet another objective of the invention is to provide for high pin fan-out for wire bond semiconductor devices.

Yet another objective of the invention is to eliminate the need for counter-balancing the effects of thick layers of dielectric used in conventional high-density wire bond semiconductor device manufacturing.

Yet another objective of the invention is to provide a method of packaging high density wire bond semiconductor devices by using Build Up Multilayer (BUM) technology in combination with thin film deposition techniques.

Yet another objective of the invention is to provide an initial surface with good planarity for the creation of high-density wire bond semiconductor structures.

A still further objective of the invention is to provide a structure devoid of warpage and dimensional variations during high temperature or wet chemical processing for the creation of high-density wire bond semiconductor structures.

In accordance with the objectives of the invention a new method is provided for mounting high-density wire bond semiconductor devices. The invention starts with a metal panel (also referred to as the metal substrate); a layer of dielectric is deposited over the first surface of the metal panel. One or more thin film interconnect layers are then created on top of the dielectric layer. The interconnect layers are patterned in succession to create metal interconnect patterns. The BUM technology allows for the creation of a succession of layers over the thin film layers. Each of the BUM layers created in this manner can be created for a specific function such as power or ground distribution and signal or fan-out interconnect. The combined layers of thin film and BUM form the interconnect substrate.

One or more cavities are created in the second surface of the metal panel; openings through the layer of dielectric are created where the wireable metal pad underneath the dielectric is exposed within the perimeter of the cavities. In addition, a metal die pad underneath the dielectric is partially or completely exposed to facilitate die attach and heat removal. One or more semiconductor die are inserted into the substrate cavity and are wire bonded to the openings that have been created in the layer of dielectric.

After the fabrication of the metal panel is complete, each substrate on the panel is tested. The substrates are singulated from the panel by cutting. Openings are created in the bottom BUM layer; solder balls are inserted and attached to this BUM layer for the completion of the Ball Grid Array (BGA) package.

DESCRIPTION OF THE PREFERRED EMBODIMENTS

Figure 1:
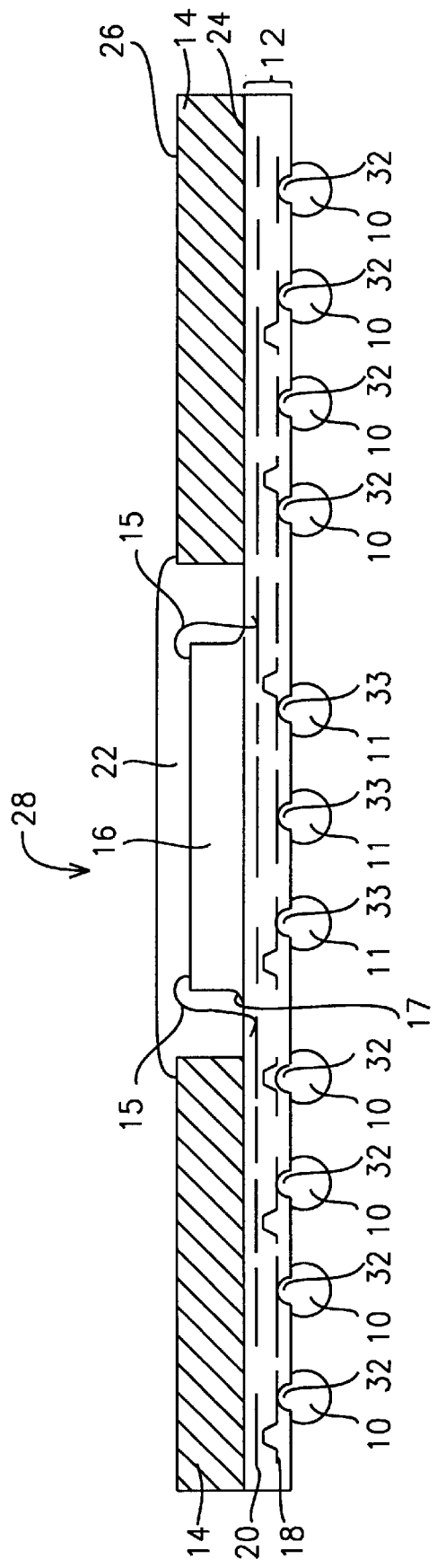
FIG. 1 shows a single chip wire bond chip package with two interconnect layers.

Referring now specifically to FIG. 1, there is shown a cross section of a single wire bond chip with two interconnect layers.

The interconnect substrate 12 contains the totality of the sequence of layers that are created within the scope of the invention for making a high density packaging substrate.

The interconnect substrate 12 that has two surfaces. The surface of the interconnect substrate into which the contact balls 10 are mounted is the first surface of the interconnect substrate. The surface of the interconnect that is in contact with the metal substrate 14 is the second surface of the interconnect substrate.

The metal substrate 14 has two surfaces, the first surface 24 of the metal substrate 14 is the surface on which the interconnect substrate 12 is created. The second surface 26 of the metal substrate is the surface into which openings are etched for the insertion of wire bond chips.

The metal layer within the interconnect substrate 12 that is closest to the first surface 24 of the metal substrate 14 is referred to as the bottom layer, the metal layer within the interconnect substrate 12 that is furthest removed from the first surface 24 of the metal substrate 14 is referred to as the top layer.

The two interconnect layers within the interconnect substrate 12 are highlighted as 18 (which can be a ground or power layer) and 20 (which can be a signal layer). Metal substrate 14, typically copper, is between about 30 to 40 mils thick. The metal used for substrate 14 is not limited to copper but can be other metals such as aluminum or stainless steel.

The size of the metal substrate 14 is typically 18×24 inches but the size of the metal substrate 14 is not limited to these dimensions. The process of creating the package of the invention starts with a large metal panel that contains adequate surface area for the creation of a multiplicity of wire bond packages. This large metal substrate is at a given point in the process divided into a number of smaller metal substrates whereby each of these smaller metal substrates is used to further create one package of the invention.

The invention uses the Build Up Multilayer (BUM) technology (a printed circuit board technology) in combination with thin film deposition technology (a semiconductor like technology used for the creation of multi chip modules or flat panels).

It must be noted from FIG. 1 that the metal substrate 14 and the contact balls 10 are mounted on opposite sites of the interconnect substrate 12 while the metal substrate 14 and the contact balls 10 are also aligned with each other (the metal substrate 14 is located above the contact balls 10). It must further be noted from FIG. 1 that additional contact balls 11 are provided for connections to the interconnect substrate 12, these contact balls 11 are located directly underneath the wire bond chip 16. The wire bond chip 16 is mounted in an opening 28 that has been created in the metal substrate 14. The opening 28 into which the wire bond chip 16 is mounted is a cavity that is created by masking and etching of the second side 26 of the metal substrate 14.

A dielectric layer (not shown) is first deposited over the metal substrate 14 on the first side 24 of the metal substrate 14. This deposition of the dielectric can be done by either lamination or by a coating and curing process. The layer of dielectric typically has a thickness of between about 10 and 50 um. It a required that the dielectric has a TCE (Thermal Coefficient of Expansion) that is higher than the TCE of the metal substrate. This to assure that, after the metal substrate with the deposited layer of dielectric are cooled down to room temperature, the dielectric film is under tension. The dielectric layer can be epoxy with or without a thin glass reinforcement, a polyimide film or any other build-up dielectric material.

The first step in the creation of the interconnect substrate 12 is the creation of a thin film interconnect metal layer 20 on top of the layer of dielectric.

Figure 2A:
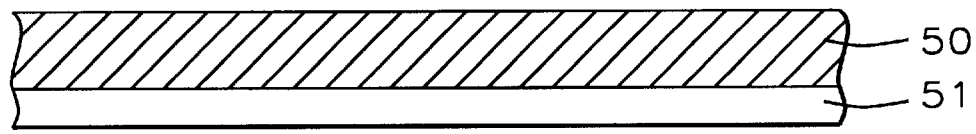
FIG. 2 shows the processing steps used during the thin film deposition process.
Figure 2B:
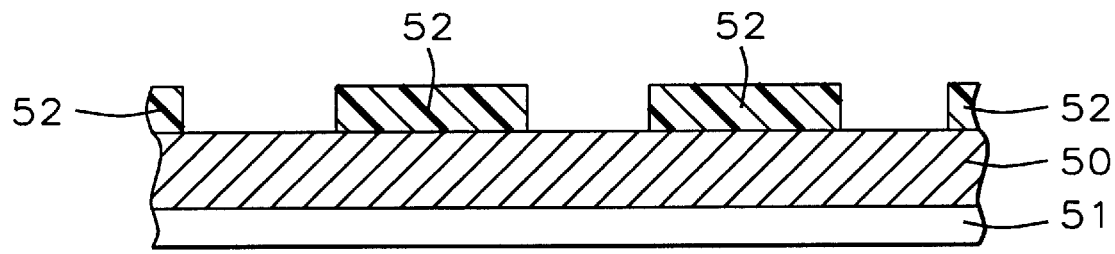
Figure 2C:
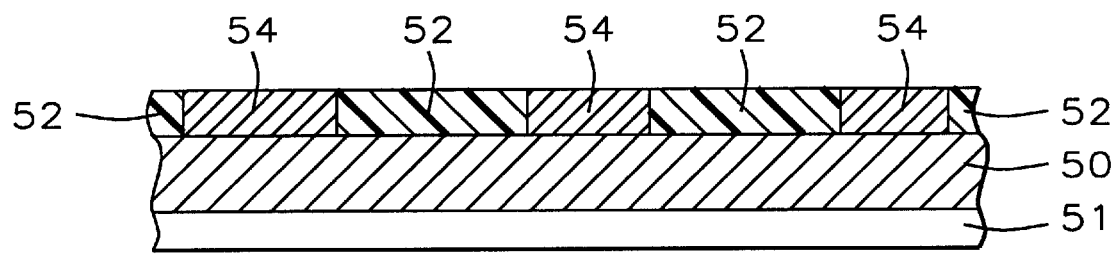
Figure 2D:
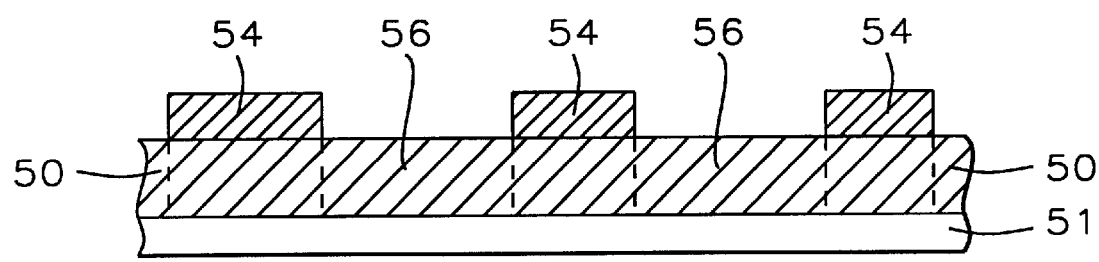
Figure 2E:
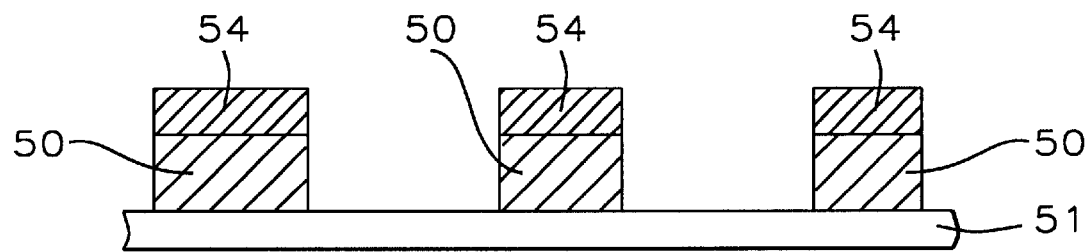
Figure 2F:
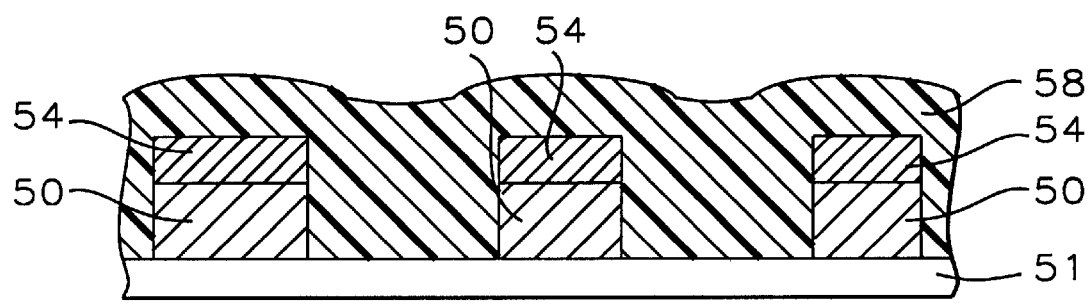

The thin film deposition technique contains the following steps, see FIG. 2:

FIG. 2a, depositing an interconnect plating base 50 by consecutive sputtering of Cr, Au and Cr FIG. 2b, masking and patterning 52 for semi-additive plating of the interconnect pattern;

FIG. 2c, wet etching the thin Cr layer to expose the Au, depositing semi-additive plating 54 of the interconnect pattern by depositing Au, Ni and Cu;

FIG. 2d, removing of the mask 52 (FIG. 2b) for the semi-additive plating of the interconnect pattern;

FIG. 2e, wet etching to remove the sputtered plating base 56, FIG. 2d, from between the interconnect pattern 54;

FIG. 2f, coating the created interconnect pattern with a layer 58 of dielectric;

for applications where wire bond connections need to be made to the interconnect pattern the above dielectric forms a solder mask and vias are created in the dielectric for the solder connections.

It must be pointed out that, where the example of FIG. 1 shows the creation of only one layer of thin film, the invention is not limited to one layer of thin film. A number of thin film layers can be superimposed, dependent on and determined by design packaging requirements. Where limitations arise in the number of overlying layers of thin film that can be applied, these limitations are not limitations that are imposed by the invention but are rather conventional limitations of thin film deposition technology or electrical performance characteristics.

The state of the art BUM technology provides the technology to add layer 18 on top of the created thin film interconnect layer 20, this added layer 18 typically can be for power and ground interconnects but can also be used for fan-out interconnections. Patterns are created in the additional layer 18, typically for ground and power distribution but not limited to this.

It must further be pointed out that, although the example shown in FIG. 1 shows only one BUM layer, the invention is not limited to only one such layer. The invention allows for a multiplicity of BUM layers that can be superimposed over one or more thin film layers.

It must also be pointed out that the invention does not require that a BUM layer is deposited over the thin film layer. It is entirely conceivable that the package of the invention is created using no BUM layers and that the interface substrate contains two or more layers of thin film.

The last layer created in this manner, that is the layer 18 in FIG. 1 or the layer furthest removed from the first side 24 of the metal substrate 14, must provide the interconnects with the contact balls of the BGA structure and must therefore be coated as a solder mask.

Figure 3A:
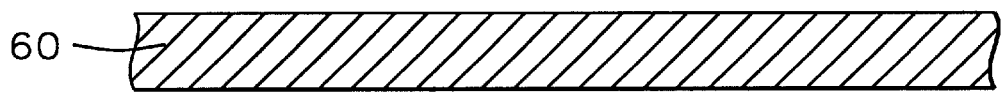
FIG. 3 shows the processing steps used during the BUM process.
Figure 3B:
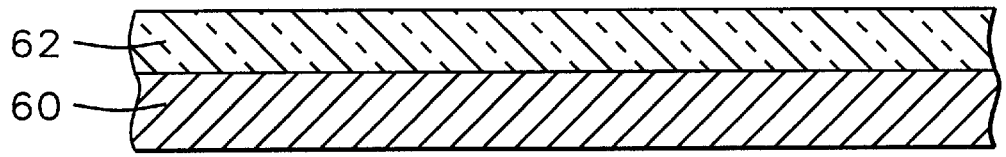
Figure 3C:
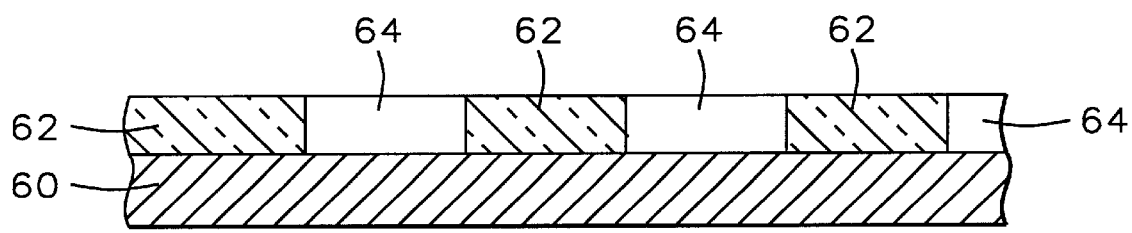
Figure 3D:
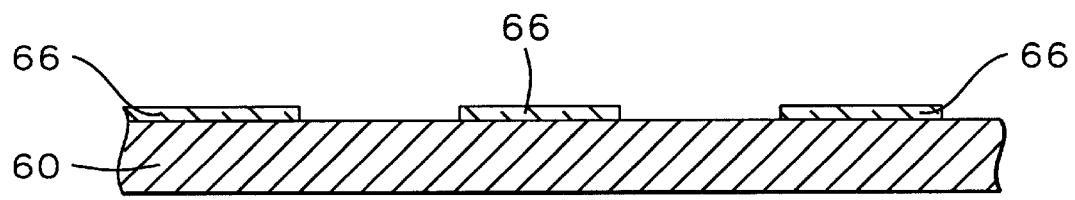
Figure 3E:
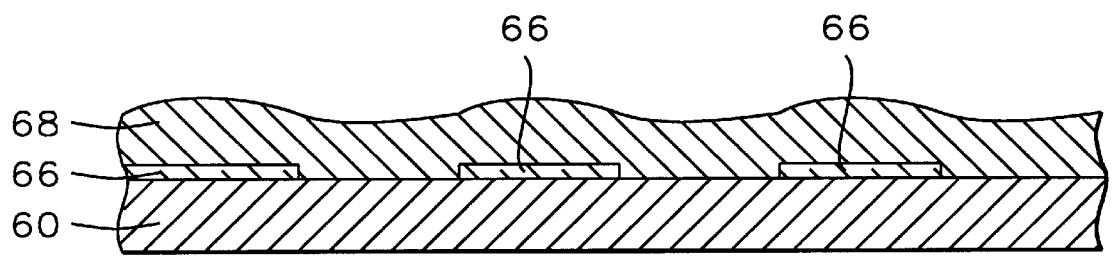
Figure 3F:
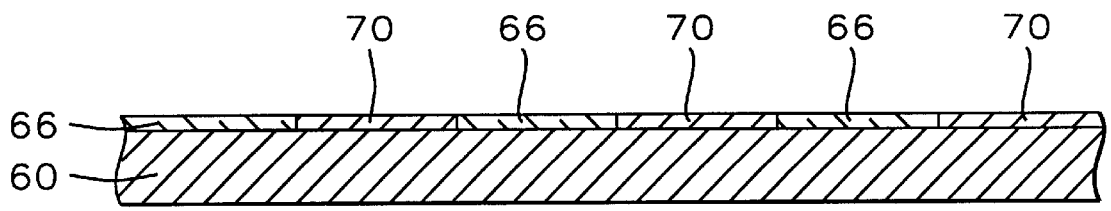

The BUM state of the art technology contains the following processing steps, see FIG. 3:

FIG. 3a, cleaning of the surface of the metal substrate 60;

FIG. 3b, coating of the metal substrate with a dielectric;

FIG. 3c, creating of vias 64 in the dielectric 62 for electrical connections to the metal substrate 60;

FIG. 3d, etching and swelling of the dielectric 66 to roughen the surface and thereby promote adhesion for the subsequent electroless copper deposition;

FIG. 3d, electroless seeding of the dielectric;

FIG. 3e, plating of the panel with a layer 68 of copper;

FIG. 3f, masking and etching the deposited layer of copper to create the metal pattern 70 in the BUM layer.

The second side 26 of the metal substrate must next be prepared for the mounting of the wire bond chip; an opening or cavity 28 must therefore be created in the metal substrate 14 that can accommodate the wire bond chip. The second side 26 of the metal substrate 14 is therefore masked and wet etched to create the opening 28 in the metal substrate 14. The size of this opening can vary and depends on the number of wire bond chips that are to be mounted on the interconnect substrate 12. The wet etch of the second side 26 of the metal substrate exposes the dielectric layer that has previously been deposited (on the first side 24 of the metal substrate 14, see above).

It is clear that, although FIG. 1 indicates the mounting of only one IC die 16 inside opening 28, the invention is not limited to one die. By creating a larger opening 28 (or a multiplicity of openings) a multiplicity of IC dies can be inserted into the metal substrate and can, again using wire bond techniques, be interconnected to the interface substrate.

After the cavity 28 has been created in the second surface 26 of the metal substrate 14 (thereby exposing the layer of dielectric that has been deposited over the first surface 24 of the metal substrate), openings are created in the exposed layer of dielectric through which electrical contact is established with points of contact in the bottom layer 20 of the interface substrate 12. One large opening or a matrix of small openings are created in the exposed layer of dielectric on top of a metal die pad onto which the die is to be placed for the die bonding and heat removal purposes. These openings are created using laser technology.

At this point in the process, the metal panel is subdivided or singulated into individual metal panels for individual wire bond packages. Each substrate is electrically tested either before or after the metal panel is subdivided into individual substrates.

Before the wire bond chip is inserted into cavity 28, an adhesive layer 17 is provided over the surface of the exposed die pad inside opening 28. The wire bond chip 16 is inserted into the cavity 28, the wire bond chip 16 is wire bonded 15 to the bottom layer 20 of the interconnect substrate. After the wire bond chip 16 has been inserted into the cavity 28 and the wire bonding has been completed, a glob top or over molding (typically using epoxy) 22 is applied over the wire bond chip 16 thereby providing further protection for the die 16.

The openings 32 and 33 for the BGA solder ball connections are created to expose the top metal pads (the pads in the interconnect layer 18 that are furthest away from the metal substrate 14). Interconnect layer 18 is brought into contact with the contact balls 10 and 11, the contact balls are attached to layer 18 by reflow of the contact balls.

It is clear that the packaging of the IC die is at this time completed. Electrical contacts have been established by connecting the Ball Grid Array solder balls 10/11 (through the interface substrate 12 and the wire bond connections 15) to the wire bond pads on the IC die 16.

The invention provides a method for mounting a wire bond IC chip within a metal substrate whereby the IC chip is mounted with its active surface (the surface that contains the points of electrical contact of the chip) facing upwards, that is facing away from the above defined interconnect substrate. It is for this reason that the invention has been designated as a cavity-up (wire bond) package. The chip 16 is connected to the interconnect substrate 12 using wire bonding 15, as indicated. The chip is further brought into close physical contact with the underlying interconnect substrate 12 by means of the adhesive layer 17 that has been applied between the chip 16 and the interconnect substrate 12. The combination of surfaces and substances that surround the IC die 16, that is the adhesive layer 17, the (epoxy) glob top/over molding 22 and the interconnect substrate 12, provide a substantial and direct path of heat flow from the IC die 16 to the metal substrate 14 from where the heat can further be conducted away from the IC die 16 through the solder balls 10 and 11 and into the printed circuit board onto which the package is mounted. Typical thin film dielectric have a thickness between about 0.5 and 1.0 mil and are therefore not a significant inhibitor to heat transfer. Conventional plastic BGA packages use FR4/BT laminates that are several mils thick and have therefore a high resistance to heat transfer. The invention therefore provides a key advantage of significantly improving the cooling of the IC devices that are mounted in the package of the invention.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A structure for mounting one or more wire bond Integrated Circuit chips by creating an interface substrate overlying a metal substrate, said structure containing:

a metal substrate said metal substrate having a first surface and a second surface;

a layer of dielectric with a thickness between about 10 and 50 um. deposited over said first surface;

a thin film interconnect layer deposited over of said layer of dielectric thereby forming the first layer of an interconnect substrate;

a Build Up Multilayer (BUM) layer created over said interconnect layer thereby forming the second layer of an interconnect substrate;

one or more openings for the insertion of said one or more wire bond chips created by masking and etching said second surface of said metal substrate thereby furthermore creating exposed portions of said dielectric within said openings;

openings selectively created in said exposed dielectric thereby providing electrical access and heat transfer to said interconnect substrate for said one or more wire bond chips;

individual wire bond substrates created by subdividing said metal substrate;

a layer of adhesive containing thermally conductive epoxy such as thermoset or thermoplastic epoxy created by coating said exposed dielectric of said individual wire bond substrates;

one or more wire bond chips inserted into said one or more openings for the insertion of said wire bond chips in said individual wire bond substrates whereby said wire bond chips overlay said adhesive coating;

wire bonds for said wire bond chips to said selectively created openings in said dielectric;

a molding compound inserted over said one or more wire bond chips and within said one or more openings for the insertion of said wire bond chips;

a coating over said BUM layer as a solder mask;

the metal pads within said BUM layer created by etching thereby creating openings for BGA solder connections; and solder balls inserted and attached to said BGA solder connections.

2. The structure of claim 1 wherein said interface substrate contains when proceeding from the side of the interface substrate that is closest to said metal substrate:

one or more thin film interconnect layers deposited over said dielectric layer;

a coating of dielectric over the thin film layer that is furthest removed from said metal substrate; and a solder mask thereby creating vias in said coating of dielectric over said thin film layer for connections between said thin film layer and the BGA contact balls.

3. The structure of claim 1 wherein said interface substrate contains when proceeding from the side of the interface substrate that is closest to said metal substrate:

one or more thin film interconnect layers deposited over said dielectric layer;

one or more BUM layers deposited over said second interconnect layer;

a coating of dielectric over the BUM layer that is furthest removed from said metal substrate; and a solder mask thereby creating vias in the dielectric for connections between said BUM layer and the BGA contact balls.

4. The structure of claim 1 whereby said claim is extended to include creating a multiplicity of Build Up Multilayer structures and a multiplicity of thin film interconnect layers said BUM layers overlying said thin film interconnect layers said thin film interconnect layers to be deposited over said dielectric deposited on said first surface of said metal substrate.

* * * * *